United States Patent [19]
Lallement et al.

[11] Patent Number: 5,269,365
[45] Date of Patent: Dec. 14, 1993

[54] CASTING MOLD FOR SINGLE CRYSTAL SOLIDIFICATION CASTING

[75] Inventors: Bernard L. Lallement, Eaubonne, France; Ghislaine E. Lamanthe, Tokyo, Japan; Alain Puissant, Yutz, France

[73] Assignee: Societe National d'Etude et de Construction de Moteurs d'Aviation du General S.N.E.C.M.A., Paris, France

[21] Appl. No.: 724,789

[22] Filed: Jul. 2, 1991

[30] Foreign Application Priority Data

Jul. 4, 1990 [FR] France ............................ 90 08446

[51] Int. Cl.⁵ .................................................. B22D 27/04
[52] U.S. Cl. .................................. 164/361; 164/122.2
[58] Field of Search ............... 164/349, 359, 360, 361, 164/122.1, 122.2, 125, 122

[56] References Cited

U.S. PATENT DOCUMENTS

| | | |
|---|---|---|
| 3,627,015 | 6/1970 | Giamei et al. |
| 3,787,190 | 1/1974 | Giamei et al. |
| 3,810,504 | 5/1974 | Piwonka |
| 4,862,947 | 9/1989 | Horton et al. ............ 164/122.2 |

FOREIGN PATENT DOCUMENTS

| | | |
|---|---|---|
| 0066971 | 12/1982 | European Pat. Off. |
| 0082100 | 6/1983 | European Pat. Off. |
| 1483578 | 12/1972 | Fed. Rep. of Germany ...... 164/360 |
| 1481366 | 5/1965 | France |
| 2037137 | 12/1970 | France |
| 57-88946 | 6/1982 | Japan ................... 164/349 |
| 1454635 | 11/1976 | United Kingdom ............ 164/122 |

*Primary Examiner*—Kuang Y. Lin
*Attorney, Agent, or Firm*—Bacon & Thomas

[57] ABSTRACT

A casting mold is disclosed for preventing growth of parasitic grains in the casting of a workpiece from a liquid metal by a single crystal solidification technique. The mold has a mold portion which defines a casting cavity in the shape of the desired workpiece as well as a feeder portion which defines a separate feeder cavity not in communication with the casting cavity. The feeder portion is in heat exchange contact with the mold and is located adjacent to the areas of the workpiece in which a parasitic grain may be nucleated during the controlled solidification. The feeder portion is filled with a thermal mass which emits heat to slow the liquid metal solidification in these zones in order to prevent a growth of the parasitic grain. The thermal mass in the feeder cavity may consist of a liquid metal which undergoes a phase change at the same temperature, or a slightly higher temperature than that of the liquid metal located in the casting cavity from which the workpiece is cast.

9 Claims, 1 Drawing Sheet

CASTING MOLD FOR SINGLE CRYSTAL SOLIDIFICATION CASTING

BACKGROUND OF THE INVENTION

The present invention relates to a casting mold for casting workpieces from liquid metal by a single crystal solidification process. The invention finds particular usage in the casting of gas turbine engine blades from superalloy materials.

In known single crystal solidification casting processes a mold is supplied with a molten metal through its upper region and the solidification is controlled such that the solidification front moves gradually vertically through the mold. Typically, a grain selection device is located adjacent to a lower region of the mold and selects a single crystal grain at its discharge outlet. Such known casting methods for single crystal parts are illustrated and described in French patents 1,481,366 and 2,037,187.

A number of techniques are used to achieve a specific crystallographic orientation in the workpiece and to achieve an adequate grain selection. Despite these techniques, problems have existed with the casting of gas turbine engine blades, particularly those blades with platforms. In casting the platform blades, parasitic grains may appear in the blade platform, or the configuration of the platform would preclude certain grain selection. Additionally, the techniques used to cast such platform blades have proven to be extremely lengthy, complex and costly, as well as resulting in excessive numbers of unacceptable parts.

The parasitic grain germination which takes place in the blade platform is caused by a too rapid and premature cooling of the liquid metal in the blade platform. This induces the solidification of the metal from the periphery of the platform independently of the solidification of the remainder of the blade structure. When making a workpiece by the single crystal solidification process, it is necessary to grow a nucleus inside a volume of liquid metal within which no point has reached its liquidis temperature. It has proven to be extremely difficult to control this condition, especially in the case of casting a blade platform wherein the temperature gradient extends normally in a direction generally perpendicular to the larger dimensions (the length and the width) of the blade platform.

The heterogeneous germination of a parasitic grain in the blade platform is enhanced by:

high mold roughness at the time of solidification, which may be aggravated during casting by the reactivity between the high-temperature mold shell and the liquid metal;
a high volume-to-surface ratio;
sharp points or edges.

Under such conditions, the permissible supercooling or solidification delay may not exceed a few degrees. Consequently, as soon as the mold walls and a volume element of the platform reach the liquidis temperature of the cast alloy, there will be a danger of parasitic nucleation and growth of a grain which results in a defective workpiece.

The problems associated with the known techniques are illustrated in FIG. 1, which is a top view of a platform blade 1. The portion 2 has a grain structure resulting from the initial nucleus and is located in the blade airfoil portion 3 as well as a portion 4a of the platform 4. The platform 4 has a length and a width significantly larger than its thickness. The portion 4b of the platform denoted by the hatching lines has a grain structure resulting from a parasitic grain growth.

One proposed solution to this problem was to place a parallel grain input duct between the grain selector outlet and the zone of the blade platform. In this method, the initial grain orientation is reproduced at the cold point of the platform where the grain is growing simultaneously with that of the central portion of the blade. As the growth continues, the two grain portions are bonded together.

However, this technique was extremely difficult to successfully carry out, being both time consuming and specific to each workpiece design. The supply duct adjoining the workpiece required meticulous work in regard to its assembly and removal, which usually was accomplished by forming it in segments. Such segmentation required additional finishing of the workpiece once it had been removed from the mold. Misorientation can occur during grain reattachment and the presence of the supply duct, in some cases, caused grains to recrystallize. All of these drawbacks prevented this technique from resolving the known problems relating to the mass production of such articles.

SUMMARY OF THE INVENTION

A casting mold is disclosed for preventing growth of parasitic grains in the casting of a workpiece from a liquid metal by a single crystal solidification technique. The mold has a first mold portion which defines a casting cavity in the shape of the desired workpiece as well as a second mold portion which comprises a separate thermal mass cavity not in communication with the casting cavity. The second mold portion is located adjacent to the areas of the workpiece in which a parasitic grain may be nucleated during the controlled solidification and is filled with a thermal mass which slows the liquid metal solidification in these zones in order to prevent a growth of the parasitic grain. During the casting process, the thermal mass thermal mass may consist of a liquid metal which undergoes a phase change at the same temperature, or a slightly higher temperature than that of the liquid metal located in the casting cavity from which the workpiece is cast.

In the case of a platform blade structure, the second mold portion may be located on either side of the area of the mold which defines the platform.

DETAILED DESCRIPTION OF THE PREFERRED EMBODIMENT

Figure 1:
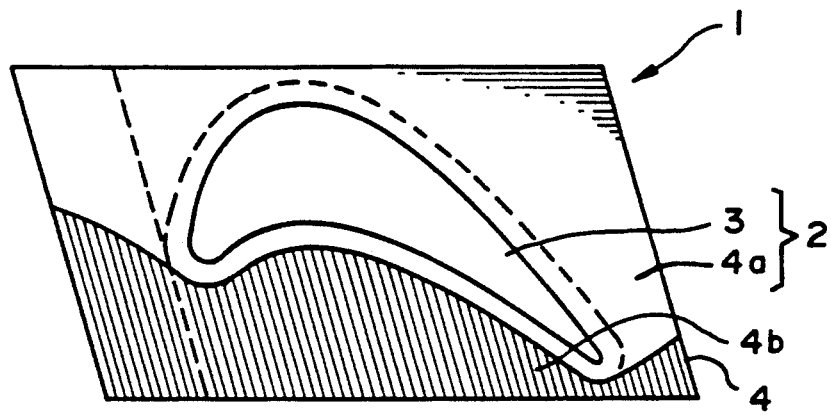
FIG. 1 is a top view of a turbine platform blade made by a single crystal casting technique having a parasitic grain defect.
Figure 2:
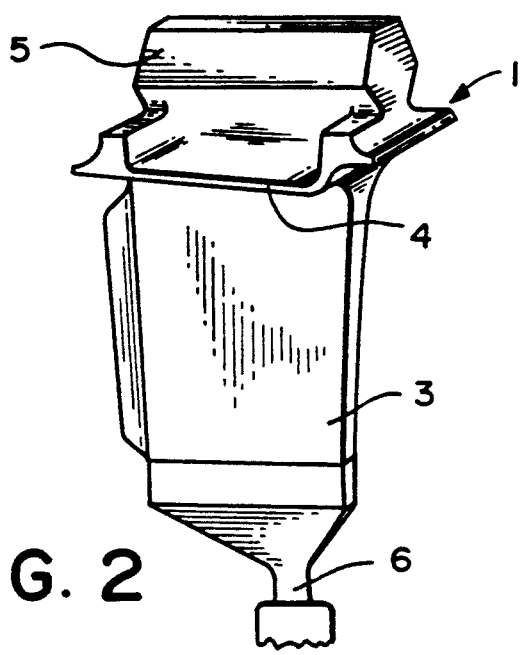
FIG. 2 is a perspective view of a turbine platform blade installed in a cluster casting mold.

A platform turbine blade 1 is illustrated in FIG. 2 and comprises a foot portion 5, an airfoil portion 3 and a platform portion 4 located between the foot and the airfoil portions. The blade 1 is illustrated in the vertical position assumed in cluster molding and link 6 to the grain selector is joined to the lower portion of the airfoil portion 3.

Figure 3:
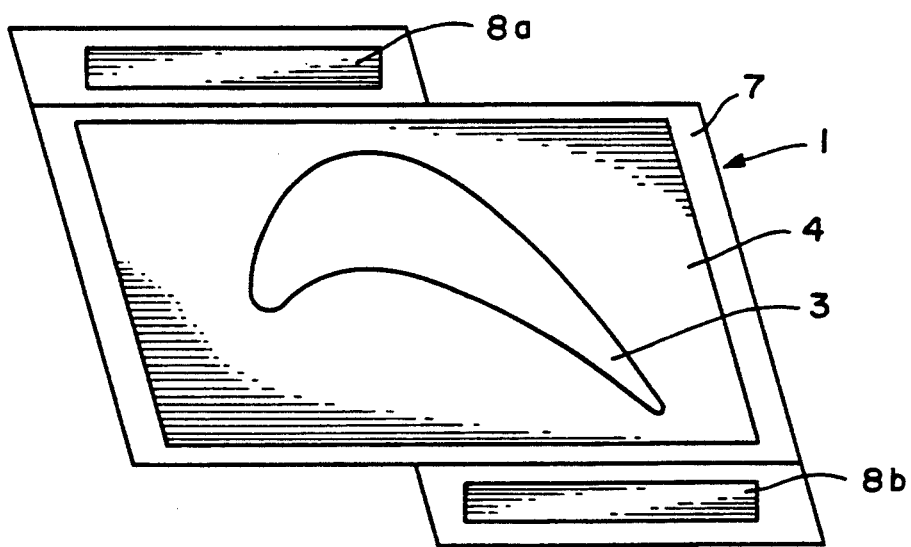
FIG. 3 is a schematic bottom view of the mold for forming a single crystal platform blade according to the present invention.

FIG. 3 is a schematic, bottom view of the blade 1 with its airfoil portion 3 and its platform portion 4. The casting mold 7 is also diagrammatically indicated and has two portions 8a and 8b located adjacent the platform 4. As can be seen, the portions 8a and 8b are located on opposite sides of the platform 4 and are offset from one another.

The portions 8a and 8b consist of thermal masses, which during the casting process may be a liquid metal undergoing a phase change at the same temperature as, or, preferably, at a temperature slightly above that of the liquid metal alloy used to cast the workpiece, which in the embodiment shown, is the turbine blade 1. The purpose of the portions 8a and 8b is to control the direction and magnitude of the thermal gradients in a horizontal plane extending generally perpendicular to the direction of the propagation of the solidification front through the blade in particular near the platform between its outer boundaries and the center of the workpiece. The use of the thermal masses prevents the appearance of a parasitic grain near the platform 4 and makes it possible to cast a defect-free, single crystal blade 1. Since the portions 8a and 8b are in heat transfer contact with the mold 7, the solidification of the thermal masses in the portions 8a and 8b emit latent heat which heats the mold adjacent to the periphery of the platform of the blade 1. Since there is no direct contact between the portions 8a and 8b, and the workpiece in the mold 7, there are no defects in the cast workpiece which must be removed by post-casting operations as in those cast by the known techniques.

The sizes of the thermal masses, as well as their shape, and locations depend upon the geometry of the particular workpiece to be cast and, especially, the critical zones where parasitic grain growth may take place. The sizes of the thermal masses must be sufficient to slow solidification of the workpiece in the zones under consideration. The thermal masses used in the portions 8a and 8b should be of high thermal capacity which causes high latent heat emission. Its shape factor must meet the condition of least surface concerning the cold zone when the mass is at the height of the thermal screens of the casting equipment. Conversely, the mold portion and the thermal mass must offer a large, conductive, heat exchange surface at the critical workpiece zone in order to transfer sufficient heat to prevent the formation of parasitic grains. Without making contact, the thermal mass must be as close as possible to the critical workpiece zone to enhance the heat transfer to the workpiece zone.

The foregoing description is provided for illustrative purposes only and should not be construed as in any way limiting this invention, the scope of which is defined solely by the appended claims.

We claim:

1. A casting mold for preventing growth of parasitic grains in the casting of a workpiece from liquid metal by single crystal solidification comprising:
   a) a mold portion defining a casting cavity in the shape of the desired workpiece; and,
   b) a second mold portion comprising at least one thermal mass such that the at least one thermal mass does not communicate with the casting cavity, the second mold portion being in heat transfer relationship with the first mold portion such that heat is transferred to a liquid metal in the casting cavity during the casting of the workpiece to prevent parasitic grain growth in the liquid metal adjacent to the location of the second mold portion.

2. The casting mold of claim 1 wherein the first mold portion defines a casting cavity having the shape of a gas turbine engine blade with an airfoil section and a platform section.

3. The casting mold of claim 2 wherein second mold portion is located such that the at least one thermal mass is adjacent to that portion of the casting cavity defining an edge of the blade platform.

4. The casting mold of claim 3 wherein the portion of the casting cavity defining the blade platform has opposite edges and wherein the second mold portion comprises two thermal masses one such thermal mass being located adjacent to each of the opposite edges of the portion of the casting cavity defining the blade platform.

5. The casting mold of claim 4 wherein the two thermal masses are offset with respect to each other.

6. The casting mold of claim 1 wherein the thermal mass comprises a second liquid metal separate from the liquid metal to be cast in the casting cavity.

7. The casting mold of claim 6 wherein the solidification temperature of the second liquid metal is not less than that of the liquid metal to be cast in the casting cavity.

8. The casting mold of claim 6 wherein the solidification temperature of the second liquid metal is approximately equal to that of the liquid metal to be cast in the casting cavity.

9. The casting mold of claim 6 wherein the solidification temperature of the second liquid metal is higher than that of the liquid metal to be case in the casting cavity.

* * * * *

UNITED STATES PATENT AND TRADEMARK OFFICE
CERTIFICATE OF CORRECTION

PATENT NO. : 5,269,365
DATED : December 14, 1993
INVENTOR(S) : LALLEMENT et al.

It is certified that error appears in the above-identified patent and that said Letters Patent is hereby corrected as shown below:

Column 2, line 34, delete "cavity";
line 41, delete "thermal mass" second occurrence.

Signed and Sealed this

Thirty-first Day of May, 1994

Attest:

BRUCE LEHMAN

Attesting Officer

Commissioner of Patents and Trademarks